United States Patent
Fukuda

(10) Patent No.: US 6,505,901 B1
(45) Date of Patent: Jan. 14, 2003

(54) ORGANIC ELECTROLUMINESCENCE DEVICE AND PROCESS FOR FABRICATING THE SAME

(75) Inventor: Yoshinori Fukuda, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/496,951

(22) Filed: Feb. 3, 2000

(30) Foreign Application Priority Data

Feb. 18, 1999 (JP) .......................................... 11-039604

(51) Int. Cl.$^7$ ................................................ H01J 63/04
(52) U.S. Cl. ........................ 312/504; 313/503; 313/505
(58) Field of Search ................................ 313/503, 504, 313/505, 498; 257/94, 96, 103

(56) References Cited

U.S. PATENT DOCUMENTS

| | | | | |
|---|---|---|---|---|
| 5,093,698 A | * | 3/1992 | Egusa ........................ | 357/17 |
| 5,399,936 A | * | 3/1995 | Namiki et al. .............. | 313/504 |
| 5,919,579 A | * | 7/1999 | Kang et al. ................. | 428/690 |
| 5,981,092 A | * | 11/1999 | Arai et al. ................... | 428/690 |
| 6,013,384 A | * | 1/2000 | Kido et al. ................. | 428/690 |
| 6,166,488 A | * | 12/2000 | Arai .......................... | 313/504 |
| 6,188,176 B1 | * | 2/2001 | Nakaya et al. ............. | 313/504 |
| 6,208,076 B1 | * | 3/2001 | Arai et al. .................. | 313/504 |
| 6,252,246 B1 | * | 6/2001 | Arai et al. ................... | 257/40 |

FOREIGN PATENT DOCUMENTS

JP        8-315981        11/1996
JP        2843924         10/1999

* cited by examiner

*Primary Examiner*—Sandra O'Shea
*Assistant Examiner*—Ismael Negron
(74) *Attorney, Agent, or Firm*—Finnegan, Henderson, Farabow, Garrett & Dunner, L.L.P.

(57) ABSTRACT

An electroluminescence device and process, the device including a metal electrode and a light-emitting layer. The light-emitting layer includes a light-emitting interface for emitting primarily light having a wavelength of $\lambda$. The process comprises the steps of: providing a light-transmitting substrate; forming a transparent electrode on the light-transmitting layer; layering organic compound material layers on the transparent electrode, the organic compound material layers forming a transparent electrode side portion having a film thickness such that an optical distance from the light-emitting interface to the interface between the light-transmitting substrate and the transparent electrode is substantially equal to even multiples of one quarter of the wavelength $\lambda$; layering the light-emitting layer on the transparent electrode side portion; layering other organic compound material layers on the light-emitting layer, the other organic compound material layers and the light-emitting layer forming a metal electrode side portion, the metal electrode side portion having a film thickness such that an optical distance from the light-emitting interface to the interface between the metal electrode and the metal electrode side portion is substantially equal to odd multiples of one quarter of the wavelength $\lambda$; and layering the metal electrode on the metal electrode side portion.

7 Claims, 5 Drawing Sheets

EMITTING LIGHT

ORGANIC ELECTROLUMINESCENCE DEVICE AND PROCESS FOR FABRICATING THE SAME

BACKGROUND OF THE INVENTION

1. Field of the Invention

The present invention relates to an organic electroluminescence device (hereinafter also referred to as organic EL device) using an electroluminescent organic compound emitting light by injection of an electric current and provided with an emission layer made from such an organic EL material and to a process for fabricating the same.

2. Description of the Related Art

Typically, an organic EL device using an organic compound material is an electric current injection type element having diode characteristics, as shown in FIG. 1, and the element emits light with luminance dependent on an amount of electric current. A display panel having a matrix arrangement of a plurality of such elements has been being developed (Japanese Unexamined Patent Publication No. Hei 8-315981). The display panel uses a substrate fabricated in the following manner. An indium-tin-oxide (so-called ITO) film is deposited on a glass substrate 2 serving as a monitor screen, and the obtained film is patterned by means of etching, thereby to obtain a substrate with an anode 3a thereon that is a transparent electrode. Each organic EL device 20 constituting the display panel has a multi-layer structure wherein a plurality of organic compound material layers 4 including a light-emitting layer and a cathode 5a (a metal electrode) have been deposited in this order on the anode 3a (a transparent electrode) by vapor deposition or the like. When required, the organic compound material layer 4 is provided with a hole transport function layer (a hole-injection layer, a hole-transport layer) and an electron-transport-function layer (an electron injection layer, an electron-transport layer) in addition to the light-emitting layer.

Conventionally, because the organic compound material layer is of high resistance, the layer having a minimized thickness has been formed in order to obtain a reduced driving voltage.

When the organic EL device 20 having the above-described constitution is fabricated by forming the organic compound material layer having a minimized thickness, there arises a problem caused by the existence of a dust of foreign matter in the vapor depositing process. As shown in FIG. 2, if a dust particle 6 exists, for example, on the anode 3a, in the vapor depositing process wherein the organic compound material layer 4 and the cathode 5a (the metal electrode layer) are successively formed on the glass substrate 2, the growing rate of the organic compound material layer 4 around the contact point between the dust particle and the anode 3a is reduced. This is because the particles obtained by vapor deposition are hardly deposited on the periphery of the part hidden by the dust particle 6 (the hidden part 6a). Accordingly, the film thickness of the organic compound material layer 4 around the dust particle 6 i.e., the film thickness of the organic compound material layer 4 between the anode 3a and the cathode 5a tends to be thinner compared with that of the other part. Consequently, the luminance may be locally changed because of current concentration caused by the proximity of the anode 3a and the cathode 5a around the dust particle 6. The element 20 could even be broken by occurrence of a short circuit caused by contact between the anode 3a and the cathode 5a.

Accordingly, a countermeasure such as the cleaning of the substrate 2 prior to deposition of each layer is taken, but the complete removal of the dust which has stuck is hardly possible by mere cleaning.

OBJECT AND SUMMARY OF THE INVENTION

In view of the problems described above, the object of the present invention is to provide an organic EL device in which an occurrence of current leak between the transparent electrode and the metal electrode is reduced and a process for fabricating the element.

According to a first aspect of the present invention, there is provided an organic electroluminescence device which comprises a light-transmitting substrate; and a transparent electrode, organic compound material layers including a light-emitting layer and a metal electrode which are formed in this order on the light-transmitting substrate;

wherein the organic compound material layers includes a light-emitting inter face of the light-emitting layer demarcating the organic compound material layers and the transparent electrode into a transparent electrode side portion and a metal electrode side portion;

wherein the transparent electrode side portion of the organic compound material layers and the transparent electrode has an interface with a largest difference in refractive indexes thereof; and wherein the transparent electrode side portion of the organic compound material layer has a film thickness equal to or larger than a thickness corresponding to a minimum value between first and second maximum values of light-emission efficiency in luminescence efficiency characteristics depending on the film thickness of the transparent electrode side portion of the organic compound material layers.

In an aspect of the invention of the organic electroluminescence device, the light-emitting interface of the light-emitting layer emitting light having a wavelength of $\lambda$ serving as a primary component, and wherein the transparent electrode side portion in the organic compound material layers is deposited to have a film thickness such that an optical distance from the light-emitting interface to the interface with the largest difference in refractive indexes is substantially equal to even multiples of one-quarter of the wavelength $\lambda$.

In another aspect of the invention of the organic electroluminescence device, the metal electrode side portion in the organic compound material layers is deposited to have a film thickness such that an optical distance from the light-emitting interface to an interface bordering on the metal electrode is substantially equal to odd multiples of one quarter of the wavelength $\lambda$.

A second aspect of the present invention is to provide a process for fabricating an organic electroluminescence device including a light-transmitting substrate; and a transparent electrode, organic compound material layers including a light-emitting layer emitting primarily light with a wavelength of $\lambda$ and a metal electrode which are formed in this order on the light-transmitting substrate; wherein the organic compound material layers includes a light-emitting interface of the light-emitting layer demarcating the organic compound material layers and the transparent electrode into a transparent electrode side portion and a metal electrode side portion; and wherein the transparent electrode side portion of the organic compound material layers and the transparent electrode has an interface with a largest difference in refractive indexes thereof;

the process comprising the steps of:
provide a light-transmitting substrate on which a transparent electrode is formed;
layering organic compound material layers in turn on the transparent electrode to form a transparent electrode side portion of organic compound material layers so as to have a film thickness such that an optical distance from the light-emitting interface to the interface with the largest difference in the refractive indexes is substantially equal to even multiples of one quarter of the wavelength $\lambda$;
layering a light-emitting layer and other organic compound material layers in turn on the transparent electrode side portion to form a metal electrode side portion of organic compound material layer so as to have a film thickness such that an optical distance from the light-emitting interface to an interface bordering on the metal electrode is substantially equal to odd multiples of one quarter of the wavelength $\lambda$; and
layering a metal electrode on the metal electrode side portion of the organic compound material layer.

In an aspect of the invention of the process for fabricating an organic electroluminescence device, the organic compound material layers and the metal electrode are deposited by means of vapor deposition.

According to the present invention, using the phenomenon wherein the high order peaks in the light-emission efficiency makes an appearance with an increase in the film thickness of the organic compound material layer, particularly in the film thickness of the transparent electrode side portion of the layer, an organic EL device is provided wherein the prevention of current leak can be accomplished without impairing the light-emission efficiency (luminance with respect to electric current) by control of the film thickness of the organic compound material layer positioned between the transparent electrode and the light-emitting layer.

DETAILED DESCRIPTION OF THE PREFERRED EMBODIMENTS

Preferred embodiments of an organic EL device and a process for fabricating the same according to the present invention will be described below with reference to the drawings.

The present inventors have made studies on the characteristics of a plurality of organic EL devices that were fabricated in the order of increasing the film thickness of the transparent electrode side portion of the organic compound material layer. They have found a phenomenon wherein high order peaks in the light-emission efficiency appear with increase in the film thickness of the transparent electrode side portion of the organic compound material layer, and attained the present invention.

It has been known that the distribution of light-emission intensity within the light-emitting layer of the organic EL device is strong on the boundary surface, wherein the hole-transport layer and the like are placed, close to the transparent electrode, and decreases with decreasing distance to the metal electrode, on which the electron-transport layer and the like are placed. That is, it is known that the distribution is an exponential distribution with respect to the film thickness of the light-emitting layer, and that the interface close to the transparent electrode is the light-emitting interface having the peak in light-emission intensity.

Figure 3:
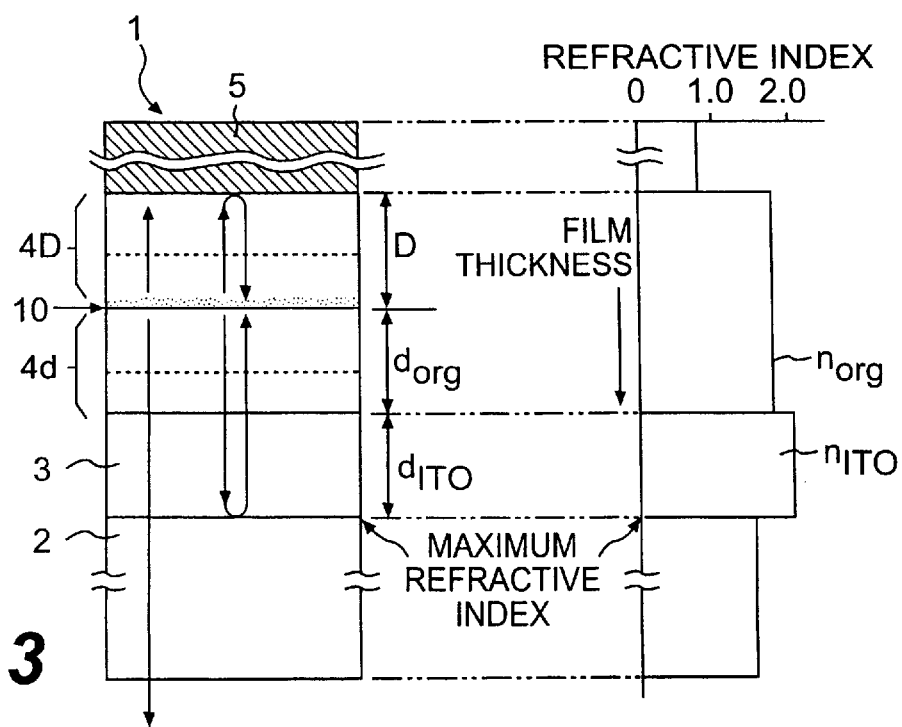
FIG. 3 is a sectional view showing the organic EL device of the present invention.

As shown in FIG. 3, in the organic EL device 1 having a structure wherein the ITO transparent electrode 3, a plurality of organic compound material layers 4d and 4D including the light-emitting layer, and the metal electrode 5 are deposited in this order on the glass substrate 2, the organic compound material layers are partitioned with the light-emitting interface 10 of the light-emitting layer into the transparent electrode side portion 4d and the metal electrode side portion 4D.

As shown in FIG. 3, in the organic EL device 1, the interface between the metal electrode 5 and the metal electrode side portion 4D of the organic compound material layer can be regarded as a total-reflecting interface. Accordingly, light traveling from light-emitting interface 10 of the light-emitting layer to the metal electrode is total-reflected and goes through the light-emitting interface 10, thereby to contribute to external light emission. As a matter of course, most of the light traveling to the transparent electrode 3 contributes to external light emission.

On the other hand, because the refractive index difference between the glass substrate 2 and the transparent electrode 3 is much larger than the differences between other adjacent layers, the interface having the largest refractive index difference in the transparent electrode side portion acts markedly as a reflecting interface. The refractive indices of materials used for fabrication of the organic EL device are as follows: the organic compound material layers 4d and 4D: about 1.8; the ITO transparent electrode 3: about 2.0; and the glass (soda-lime glass) substrate 2: about 1.5. Therefore, the difference of refractive index is 0.2 between the transparent electrode side portion 4d of the organic compound material layer and the ITO transparent electrode 3, and 0.5 between the glass substrate 2 and the transparent electrode 3. The difference of refractive index between the glass substrate 2 and the transparent electrode 3 is largest in the transparent electrode side portion. In the case of the light traveling from the light-emitting interface 10 of the light-emitting layer to the transparent electrode 3 and coming back to the light-emitting interface 10, the small difference between the transparent electrode side portion 4d of the organic compound material layer and the transparent electrode 3 is neglected, and the largest refractive index difference between the glass substrate and the transparent electrode 3 is taken into account. The largest refractive index difference can be provided not only between the glass substrate and the transparent electrode, but also within the transparent electrode side portion 4d of the organic compound metal layer, through use of materials having high refractive index deposited therein.

In the element as shown in FIG. 3, the main light-traveling route of the light emitted on the light-emitting interface is any one of the following: (1) the light goes from the light-emitting interface directly to the outside, (2) the light is reflected on the metal electrode, comes back to the light-emitting interface, and then goes outside directly, and (3) the light is reflected on the glass, comes back to the light-emitting interface, and goes outside. The light-emission efficiency is dependent on the course of interference of light in the cases of (2) and (3) wherein the light comes to the light-emitting interface. The preferable design of the film of the organic compound material layer will be described, hereinafter, regarding the light-emitting layer emitting light having a wavelength of λ and serving as a primary component.

Figure 4:
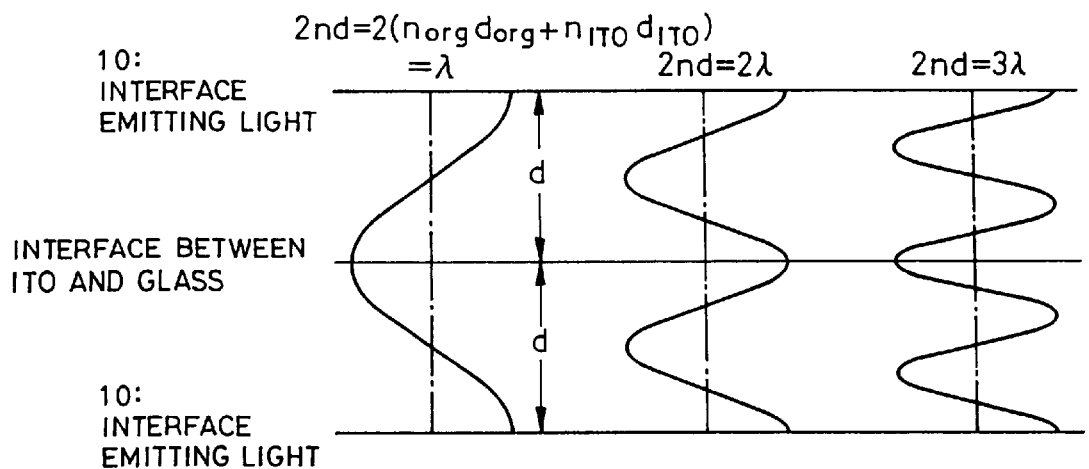
FIG. 4 is a sectional view showing the reflection at a transparent electrode side portion of the organic compound material layer in the organic EL device according to the present invention.

First, the interference in the light-traveling route (3) of the transparent electrode side portion 4d of the organic compound material layer will be considered. As shown in FIG. 3, when the refractive index is "n" and the film thickness is "d", as a whole, of the light which is reflected on the interface between the transparent electrode 3 and the glass substrate 2 and comes back to the light-emitting interface, its length of optical path (2 nd) is the sum of the length of the optical paths in the organic compound material layer and the transparent electrode, and can be expressed by the following formula:

$$2nd = 2(n_{org}d_{org} + n_{ITO}d_{ITO})$$

wherein $n_{org}$ is the refractive index of the transparent electrode side portion 4d of the organic compound material layer; $d_{org}$ is the film thickness of the transparent electrode side portion 4d of the organic compound material layer; $n_{ITO}$ is the refractive index of the transparent electrode 3; and $d_{ITO}$ is the film thickness of the transparent electrode 3. Accordingly, when the length of the optical path of the going and returning light 2nd is equal to integer multiple of the wavelength λ which is emitted and is to be taken out, the interference between the returning light and the emitted light becomes maximum. As shown in FIG. 4, therefore, the optical distance, from the light-emitting interface to the interface of the largest refractive index difference, which is used for establishment of the film thickness of the transparent electrode side portion 4d of the organic compound material layer giving the maximum interference effect, can be expressed by the following formular;

$$2(n_{org}d_{org} + n_{ITO}d_{ITO}) = j \cdot \lambda$$

$$\therefore (n_{org}d_{org} + n_{ITO}d_{ITO}) = 2j \cdot (\lambda/4)$$

wherein "j" represents an integer of 1 or more. When the total film thickness of the transparent electrode side portion 4d of the organic compound material layer and the transparent electrode 3 is established to be approximately the length of the optical distance, the interference enhances the light-emission efficiency. More specifically, the transparent electrode side portion of the organic compound material layer is deposited to have a film thickness such that the optical distance ($n_{org}d_{org} + n_{ITO}d_{ITO}$) from the light-emitting interface 10 to the interface of the largest refractive index difference is approximately equal to even multiples of one quarter of the wavelength λ.

Figure 5:
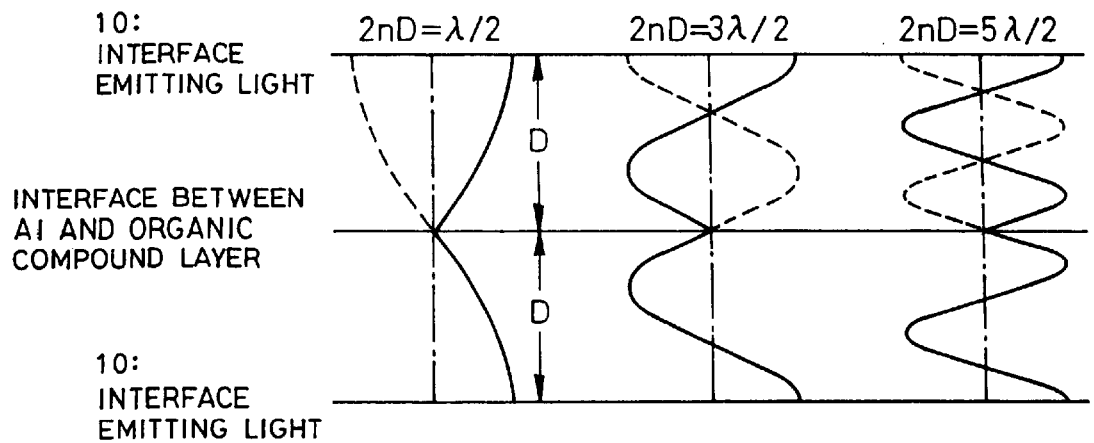
FIG. 5 is a sectional view showing the reflection at a metal electrode side portion of the organic compound material layer in the organic EL device according to the present invention.

Moreover, the interference in the light-traveling route (2) of the metal electrode side portion 4D of the organic compound material layer will be considered. As shown in FIG. 3, since the reflection occurs on the interface between the metal electrode 5 and the metal electrode side portion 4D of the organic compound material layer, a phase difference π occurs before and after the reflection of light. Accordingly, when the refractive index is "n" and the film thickness is "D", as a whole, of the metal electrode side portion 4D of the organic compound material layer of the light returning to the light-emitting interface, the length of the optical path can be expressed by 2 nD. As shown in FIG. 5, when the length of the optical path (2 nD) of the going and returning light is equal to the wavelength (λ/2, 3λ/2, 5λ/2, . . . ) of the light emitted and is to be taken out, the interference of the returning light and the emitted light becomes maximum. The film thickness of the metal electrode side portion 4D of the organic compound material layer wherein the maximum interference effect is obtained, that is, the optical distance from the light-emitting interface 10 to the metal electrode 5 can be expressed by the following formula:

$$2nD = [(2j-1)/2] \cdot \lambda$$

$$\therefore nD = (2j-1) \cdot (\lambda/4)$$

wherein "j" represents an integer of 1 or more. When the film thickness "D" of the metal electrode side portion 4D of the organic compound material layer is established to be approximately the length of the optical distance, the interference enhances the light-emission efficiency. More specifically, the film thickness "D" of the metal electrode side portion of the organic compound material layer is deposited to have a film thickness such that the optical distance nD from the light-emitting interface 10 to the interface bordering on the metal electrode 5 is approximately equal to odd multiples of one quarter of the wavelength λ.

In the case of fabrication of organic EL devices, as the first forming step of the organic compound material layer, the transparent electrode side portion of the organic compound material layer is formed on the transparent electrode formed on the light-transmitting substrate by depositing one or more of the organic compound material layers, other than the light-emitting layer emitting a light having a wavelength of λ and serving as a primary component, which have a film thickness such that the optical distance from the light-emitting interface of the light-emitting layer to the interface having the largest refractive index difference is approximately equal to even multiples of one quarter of the wavelength of λ. Subsequently, as the second forming step of the organic compound material layer, the metal electrode side portion of the organic compound material layer is formed on the transparent electrode side portion of the organic compound material layer by depositing the light-emitting layer and the remaining portion the organic compound material layer such that the light-emitting layer and the remaining portion have a film thickness wherein the optical distance from the light-emitting interface of the light-emitting layer to the interface on the metal electrode is approximately equal to odd multiples of one quarter of the wavelength of λ, and then the metal electrode is formed on the metal electrode side portion of the organic compound material layer.

Since the element has the foregoing structure, as the film thickness of the organic compound material layer is gradually increased, the film thickness wherein the phases in the above-described light-traveling routes agree with each other appears one after another. In particular, as the film thickness is increased, the element demonstrates the maximum and minimum values in the light-emission efficiency characteristics with respect to the film thickness of the transparent electrode side portion of the organic compound material layer. In other words, the light-emission efficiency characteristics depend on the total film thickness of the organic compound material layers of the transparent electrode side.

Conventionally, the film thickness of the organic compound material layer has been established in the vicinity of the first maximum value in the light-emission efficiency characteristics with respect to the film thickness. It has been known that as the film thickness is gradually increased, the light-emission efficiency tends to decrease by degrees. However, the present inventors have found that the element can be enhanced until the element obtains the second maximum value in the efficiency characteristics by increasing the film thickness until the thickness is greater than the thickness bringing the minimum value between the first and second maximum values in the light-emission efficiency characteristics.

The appearance of the high order peaks in the light-emission efficiency characteristics with respect to the film thickness was experimentally confirmed.

Figure 6:
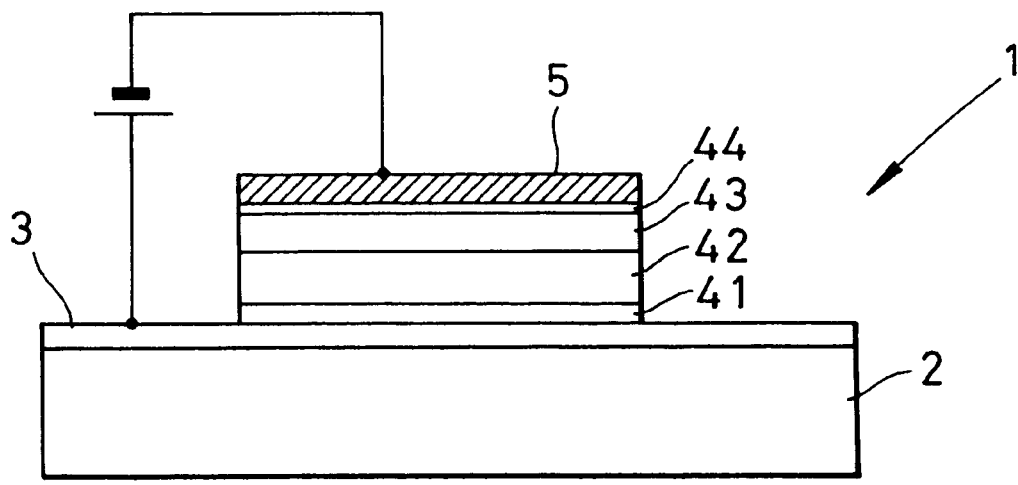
FIG. 6 is a sectional view showing an embodiment of the organic EL device of the present invention.

As shown in FIG. 6, a plurality of organic EL devices were fabricated by changing the film thickness of the hole-transport layer; they were fabricated, with a transparent electrode (anode) 3/a hole-injection layer 41/a hole-transport layer 42/a light-emitting layer 43/an electron-injection layer 44/a metal electrode (cathode) 5 which were deposited on the substrate 2 in the order. Their materials and film thickness were as follows: ITO (110 nm)/MTDATA (25 nm)/TPD (40–200 nm)/aluminum-oxine chelate Alq3 added with quinacridone (60 nm)/aluminum-lithium alloy Al—Li (100 nm). The light-emitting layer emits light having a wavelength of 525 nm and serving as a primary component.

Figure 7:
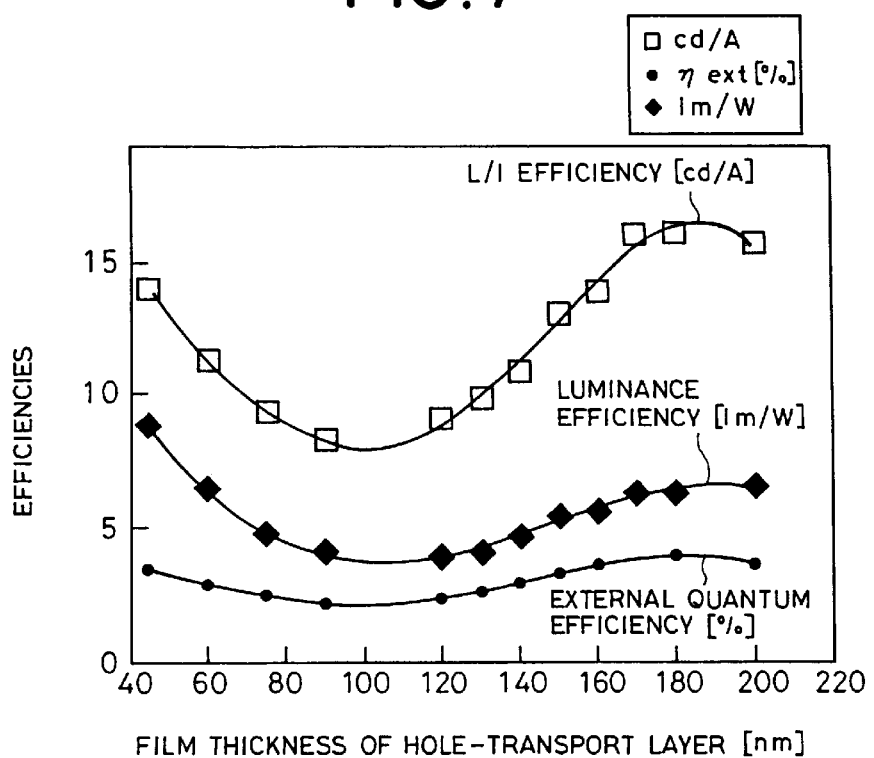
FIG. 7 is a graph illustrating the characteristics of the organic EL device of the present invention: the L/I efficiency, the luminance efficiency, and the external quantum efficiency, respectively with respect to the film thickness of the hole-transport layer of the organic EL device showing the thickness dependence of various efficiencies thereof.
Figure 8:
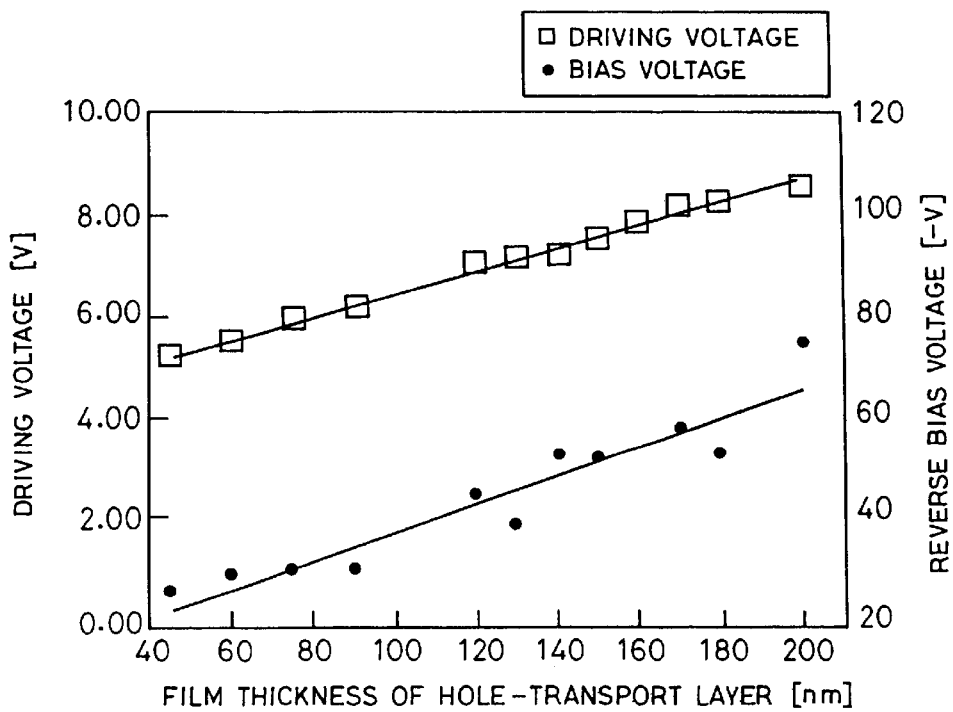
FIG. 8 is a graph illustrating the characteristics of the organic EL device of the present invention: the driving voltage and the reverse voltage, respectively with respect to the film thickness of the hole-transport layer of the element.
Figure 9:
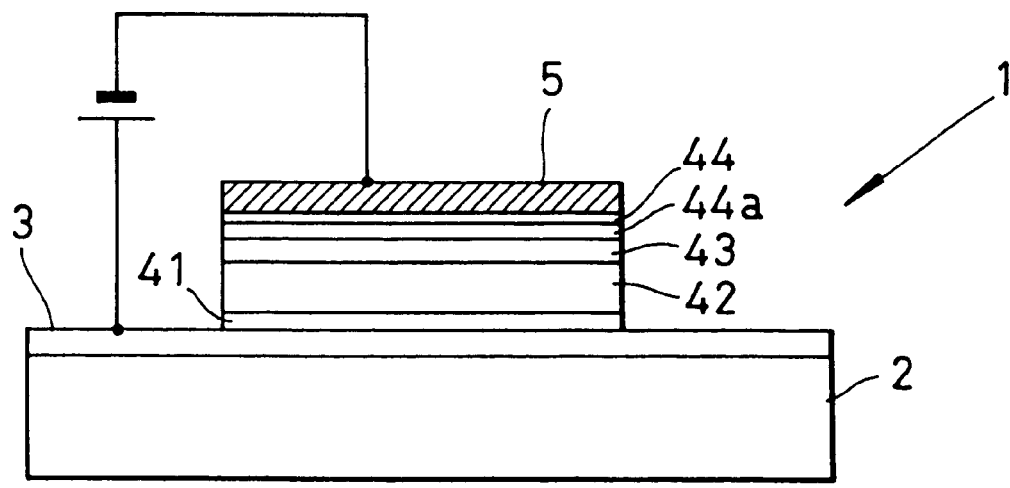
FIG. 9 is a sectional view showing another embodiment of the organic EL device of the present invention.

With respect to each element applied with a forward voltage (a voltage having the direction in which the element emits light), a luminance-current L/I efficiency, a luminance efficiency, and an external quantum efficiency were measured. A driving voltage placed at both electrodes of the element applied with a certain current in the forward direction in order for the element to emit light and a withstand voltage i.e., a voltage by which the element comes close to breaking (having a leakage of current) applied with a reverse bias voltage were measured. The results of characteristics of L/I efficiency, luminance efficiency, and external quantum efficiency, respectively with respect to the TPD film thickness, are shown in FIG. 7. The characteristics of the driving voltage and withstand voltage, respectively with respect to the TPD film thickness, are shown in FIG. 8.

As is apparent from FIG. 7, in the luminance-current L/I efficiency, the first peak is not shown but it is considered to appear in the vicinity of film thickness of 20 nm. As the TPD film thickness is increased, the minimum peak is known to appear in the vicinity of 100 nm, and the second peak in the vicinity of 180 nm. Accordingly, if the TPD film thickness is increased, the performance of a practical element is obtained by adjusting the thickness such that the high order peak is attained. Consequently, an element having TPD with a film thickness of 120 nm or more, more preferably 170 to 200 nm, is useful as a practical element. The film thickness is more than the thickness giving the minimum value between the first and second maximum values in the light-emission efficiency characteristics with respect to the TPD film thickness in the transparent electrode side portion of the organic compound material layer. As is apparent from FIG. 7, such an element is known to have an increased driving voltage-current and increased withstanding voltage with the increased TPD film thickness and to have a sufficient withstanding voltage in a film thickness of 120 nm or more giving the minimum value between the first and second maximum value in the light-emission efficiency.

Figure 1:
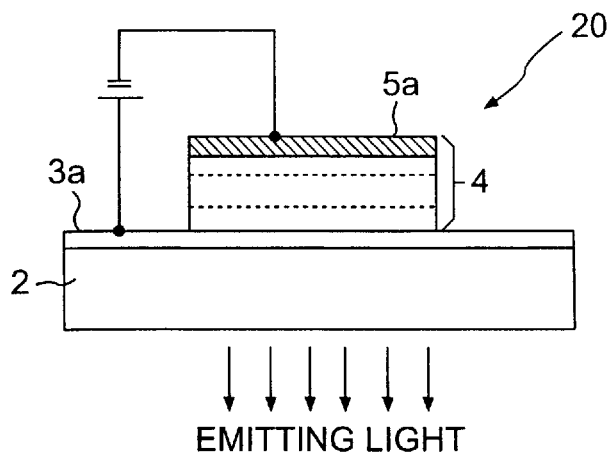
FIG. 1 is a sectional view showing an organic EL device.
Figure 2:
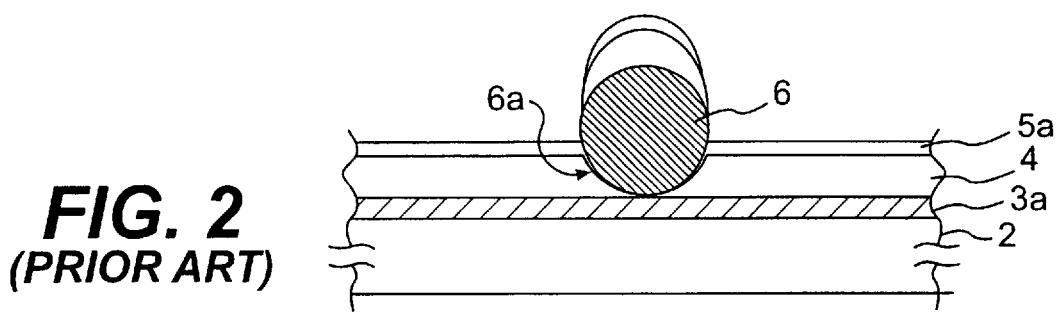
FIG. 2 is a sectional view showing an organic EL device in the fabrication process.

According to the present invention, with an increased organic compound material layer formed by means of vapor deposition, there hardly arises the current leak in the element. As shown in FIG. 2, this is because the organic compound material layer in the thin-thickness portion of the organic compound material layer 4 around the part 6a hidden by the dust particle is sufficiently deposited.

In the foregoing preferred embodiment, in the second forming step of the organic compound material layer wherein the light-emitting layer and the remaining portion of the organic compound material layer is built on the transparent electrode side portion of the organic compound material layer, the metal electrode side portion of the organic compound material layer is formed to have a film thickness such that the optical distance from the light-emitting interface of the light-emitting layer to the interface on the metal electrode is approximately equal to odd multiples of one quarter of the wavelength of λ. Optionally, in consideration of the visual-angle dependence of brightness, in order to improve this dependence, the metal electrode side portion of the organic compound material layer including the light-emitting layer is formed to have a film thickness that is thinner than the established film thickness, as disclosed in Japanese Patent No. 2843924 corresponding to the attenuation characteristics of luminance with respect to the film thickness.

In the above-described preferred embodiment, only the interface between the glass substrate 2 and the transparent electrode 3, which is the interface of the largest refractive index difference, is considered to be the reflecting interface. However, optionally, a translucent layer is provided between them with the object of using it as a reflecting interface on purpose. When a glass substrate having a refractive index that is much greater than the index of the transparent-electrode is used and its interface is used as the reflecting layer, the film thickness "d" may be established in consideration of the difference of phase π arising before and after the reflection of light. Alternatively, while the film thickness of the hole-transport layer is not changed, the film thickness of the hole-injection layer may be changed. In addition, a structure wherein a hole-injection layer is not formed, but a hole-transport layer is formed on the ITO anode may be used.

What is claimed is:

1. An organic electroluminescence device comprising:
   a substrate having a first refractive index;
   a first electrode formed on the substrate, the first electrode having a second refractive index;
   organic compound material layers including a light-emitting layer formed on the first electrode; and
   a second electrode formed on the organic compound material layers,
   wherein the light-emitting layer includes a light-emitting interface for emitting light, the light-emitting interface demarcating the organic compound material layers into a first electrode side portion and a second electrode side portion, wherein the first electrode side portion of the organic compound material layers has a third refractive index, wherein a light-emission efficiency of the light emitted from the light-emitting interface varies as a function of a film thickness of the first electrode side portion of the organic compound material layers, and the light-emission efficiency has a first maximum value corresponding to a first film thickness, a second maximum value corresponding to a second film thickness greater than the first film thickness, and a minimum value corresponding to a third film thickness between the first and second film thicknesses, and wherein the first electrode side portion of the organic compound material layer has a film thickness equal to or larger than the third film thickness.

2. An organic electroluminescence device according to claim 1, wherein the light emitted from the light-emitting interface of the light-emitting layer has a wavelength of $\lambda$ serving as a primary component, and wherein the first electrode side portion of the organic compound material layers is deposited to have a film thickness such that an optical distance from the light-emitting interface to the interface between the substrate and the first electrode is substantially equal to even multiples of one-quarter of the wavelength $\lambda$.

3. An organic electroluminescence device according to claim 1, wherein the second electrode side portion of the organic compound material layers is deposited to have a film thickness such that an optical distance from the light-emitting interface to the interface between the second electrode and the second electrode side portion of the organic compound material layers is substantially equal to odd multiples of one-quarter of the wavelength $\lambda$.

4. An organic electroluminescence device according to claim 1, wherein the difference between the first and second refractive indexes is greater than the difference between the second and third refractive indexes.

5. A process for fabricating an organic electroluminescence device, the electroluminescence device including a second electrode and a light-emitting layer, the light-emitting layer including a light-emitting interface for emitting primarily light having a wavelength of $\lambda$, the process comprising the steps of:

providing a substrate having a first refractive index;

forming a first electrode on the substrate, the first electrode having a second refractive index;

layering organic compound material layers on the first electrode, the organic compound material layers forming a first electrode side portion having a third refractive index, the first electrode side portion having a film thickness such that an optical distance from the light-emitting interface to the interface between the substrate and the first electrode is substantially equal to even multiples of one quarter of the wavelength $\lambda$;

layering the light-emitting layer on the first electrode side portion;

layering other organic compound material layers on the light-emitting layer, the other organic compound material layers and the light-emitting layer forming a second electrode side portion, the second electrode side portion having a film thickness such that an optical distance from the light-emitting interface to the interface between the second electrode and the second electrode side portion is substantially equal to odd multiples of one quarter of the wavelength $\lambda$; and layering the second electrode on the second electrode side portion.

6. A process for fabricating an organic electroluminescence device according to claim 5, wherein the organic compound material layers of the first and second electrode side portions are deposited by means of vapor deposition.

7. A process for fabricating an organic electroluminescence device according to claim 4, wherein the difference between the first and second refractive indexes is greater than the difference between the second and third refractive indexes.

* * * * *